United States Patent
Yin et al.

(10) Patent No.: US 8,514,603 B2
(45) Date of Patent: Aug. 20, 2013

(54) SERIAL ADVANCED TECHNOLOGY ATTACHMENT DUAL IN-LINE MEMORY MODULE

(75) Inventors: Xiao-Gang Yin, Shenzhen (CN); Guo-Yi Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/316,492

(22) Filed: Dec. 10, 2011

(65) Prior Publication Data
US 2013/0128446 A1  May 23, 2013

(30) Foreign Application Priority Data
Nov. 21, 2011  (CN) .......................... 2011 1 0370982

(51) Int. Cl.
*G11C 5/06* (2006.01)

(52) U.S. Cl.
USPC ................... 365/63; 365/51; 365/52; 365/54; 365/189.02; 365/230.03; 365/230.06

(58) Field of Classification Search
USPC ............... 365/51, 52, 63, 54, 189.02, 230.03, 365/230.06
See application file for complete search history.

(56) References Cited

U.S. PATENT DOCUMENTS
2008/0003845 A1*  1/2008  Hong et al. ..................... 439/67

* cited by examiner

*Primary Examiner* — Fernando Hidalgo
(74) *Attorney, Agent, or Firm* — Altis Law Group, Inc.

(57) ABSTRACT

A serial advanced technology attachment dual in-line memory module (SATA DIMM) includes a control chip having a first input output (I/O) pin and a second I/O pin, first and second switches, a resistor, and a number of storage chips connected to the control chip. First terminals of the first and second switches are respectively connected to the first and second I/O pins. Second terminals of the first and second switches are grounded. The first and second I/O pins receive different signals through controlling the first and second switches, to change work modes of the storage chips.

3 Claims, 1 Drawing Sheet

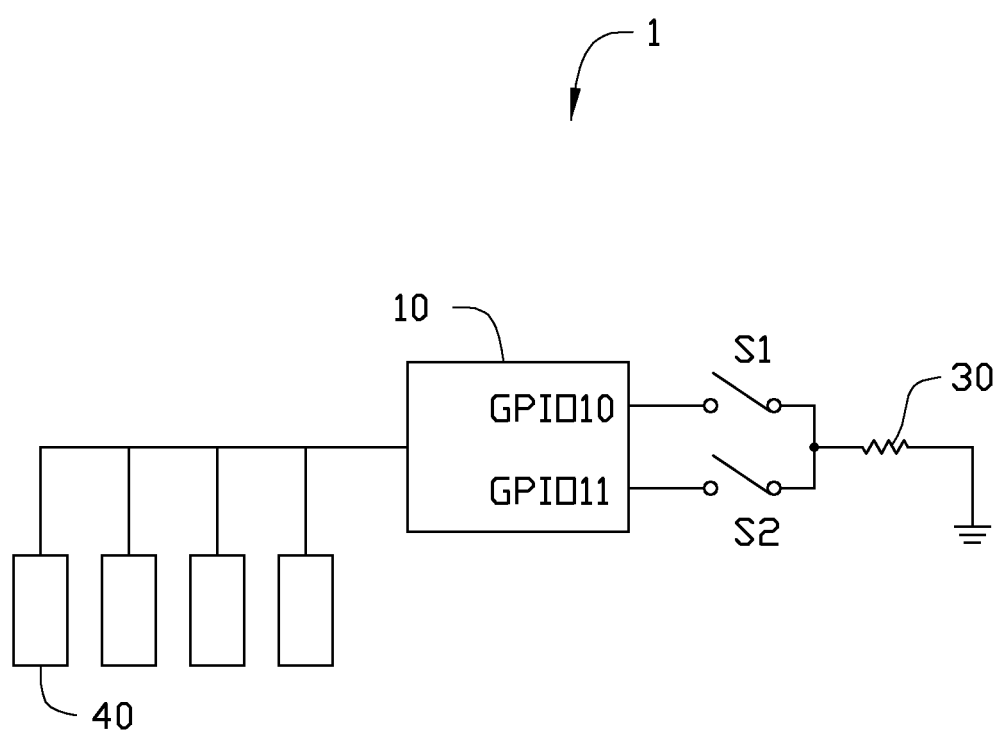

SERIAL ADVANCED TECHNOLOGY ATTACHMENT DUAL IN-LINE MEMORY MODULE

BACKGROUND

1. Technical Field

The present disclosure relates to solid state drives (SSD), and particularly to a serial advanced technology attachment dual in-line memory module (SATA DIMM).

2. Description of Related Art

Solid state drives (SSD) store data on chips instead of on magnetic or optical discs. One type of SSD has the form factor of a DIMM module and it is called a SATA DIMM module. The SATA DIMM module includes a plurality of storage chips and can be inserted into a memory slot of a motherboard, to add storage capacity. However, different types of storage chips have different work modes. Thus, layout of the SATA DIMM module needs to be changed when the storage chip needs to be replaced, causing inconvenience.

BRIEF DESCRIPTION OF THE DRAWING

Many aspects of the embodiments can be better understood with parameter to the following drawing. The components in the drawing are not necessarily drawn to scale, the emphasis instead being placed upon clearly illustrating the principles of the present embodiments. Moreover, in the drawing, like numerals designate corresponding parts throughout the several views.

The FIGURE is a circuit diagram of a serial advanced technology attachment dual in-line memory module in accordance with an exemplary embodiment of the present disclosure.

DETAILED DESCRIPTION

The disclosure, including the drawing, is illustrated by way of example and not by way of limitation. References to "an" or "one" embodiment in this disclosure are not necessarily to the same embodiment, and such references mean at least one.

Referring to the FIGURE, a serial advanced technology attachment dual in-line memory module (SATA DIMM) 1 can be inserted into a memory slot, such as a double data rate three type (DDR3) memory slot of a computer (not shown), to add storage capacity. The SATA DIMM module 1 in accordance with an exemplary embodiment includes a control chip 10, switches S1 and S2, a resistor 30, and a plurality of storage chips 40 connected to the control chip 10.

A first terminal of the switch S1 is connected to an input output (I/O) pin general purpose input output (GPIO) 10 of the control chip 10. A first terminal of the switch S2 is connected to an I/O pin GPIO11 of the control chip 10. Second terminals of the switches S1 and S2 are grounded through the resistor 30.

The I/O pins GPIO10 and GPIO11 of the control chip 10 receive different signals according to the states of the switches S1 and S2, and control the work modes of the storage chips 40 according to the received level signals. For example, when the I/O pins GPIO10 and GPIO11 receive low level signals, the storage chips 40 work in a first work mode, such as an Async mode. When the I/O pin GPIO10 is at a high level state and the I/O pin GPIO11 receives a low level signal, the storage chips 40 work in a second work mode, such as a Toggle mode. When the I/O pin GPIO10 receives a low level signal and the I/O pin GPIO11 is at a high level state, the storage chips 40 work in a third work mode, such as an ONFI2 mode. When the I/O pins GPIO10 and GPIO11 are both at high level states, the storage chips 40 work in a fourth work mode, such as an Old async mode.

In use, when the storage chips 40 need to work in the first work mode, the switches S1 and S2 are both closed, the I/O pins GPIO10 and GPIO11 of the control chip 10 receive low level signals. The control chip 10 controls the storage chips 40 to work in the first work mode. When the storage chips 40 need to work in the second work mode, the switch S1 is opened, and the switch S2 is closed. The I/O pin GPIO10 is at a high level state and the I/O pin GPIO11 receives a low level signal. The control chip 10 controls the storage chips 40 to work in the second work mode. When the storage chips 40 need to work in the third work mode, the switch S1 is closed and the switch S2 is opened. The I/O pin GPIO10 receives a low level signal and the I/O pin GPIO11 is at a high level state. The control chip 10 controls the storage chips 40 to work in the third work mode. When the storage chips 40 need to work in the fourth work mode, the switches Si and S2 are opened. The I/O pins GPIO10 and GPIO11 are both at high level states. The control chip 10 controls the storage chips 40 to work in the fourth work mode.

The SATA DIMM module 1 can change the work modes of the storage chips 40 through the switches S1 and S2, which is convenient.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A serial advanced technology attachment dual in-line memory module (SATA DIMM) comprising:
    a control chip comprising a first input output (I/O) pin and a second I/O pin;
    a resistor;
    a first switch comprising a first terminal and a second terminal, wherein the first terminal is connected to the first I/O pin of the control chip, the second terminal is grounded;
    a second switch comprising a first terminal and a second terminal, wherein the first terminal of the second switch is connected to the second I/O pin of the control chip, the second terminal of the second switch is grounded; and
    a plurality of storage chips connected to the control chip;
    wherein the first and second I/O pins of the control chip receive different signals through controlling the first and second switches, to change work modes of the plurality of storage chips.

2. The SATA DIMM module of claim 1, wherein the work modes of the storage chips comprises first to fourth work modes, the first work mode is an Async mode, the second work mode is a Toggle mode, the third work mode is an ONFI2 mode, the fourth work mode is an Old async mode; when the first and second I/O pins receive low level signals through closing the first and second switches, the storage chips work in the first work mode; when the first I/O pin is at a high level state and the second I/O pin receives a low level signal through opening the first switch but closing the second switch, the storage chips work in the second work mode; when the first I/O pin receives a low level signal and the second I/O pin is at a high level state through closing the first switch but opening the second switch, the storage chips work in the third work mode; when the first and second I/O pins are at high level states through opening the first and second switches, the storage chips work in the fourth work mode.

3. The SATA DIMM module of claim 1, wherein the second terminals of the first and second switches are grounded through the resistor.

\* \* \* \* \*